(12) United States Patent
Emi et al.

(10) Patent No.: US 8,103,980 B2
(45) Date of Patent: *Jan. 24, 2012

(54) BEAM DOSE COMPUTING METHOD AND WRITING METHOD AND RECORD CARRIER BODY AND WRITING APPARATUS

(75) Inventors: Keiko Emi, Ibaraki (JP); Junichi Suzuki, Shizuoka (JP); Takayuki Abe, Kanagawa (JP); Tomohiro Iijima, Shizuoka (JP); Jun Yashima, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 203 days.

This patent is subject to a terminal disclaimer.

(21) Appl. No.: 12/566,525

(22) Filed: Sep. 24, 2009

(65) Prior Publication Data

US 2010/0015537 A1   Jan. 21, 2010

Related U.S. Application Data

(63) Continuation of application No. 11/460,848, filed on Jul. 28, 2006, now Pat. No. 7,740,991.

(30) Foreign Application Priority Data

Oct. 25, 2005 (JP) .................................. 2005-309247

(51) Int. Cl.
   *G06F 17/50* (2006.01)
   *G06F 19/00* (2011.01)
   *G03F 1/00* (2006.01)
   *G03C 5/00* (2006.01)
   *G06K 9/00* (2006.01)

(52) U.S. Cl. .................... 716/50; 430/4; 430/5; 430/30; 382/141; 382/144; 382/145; 700/121; 716/51; 716/53; 716/55

(58) Field of Classification Search .................. 700/121; 382/141, 144–145; 716/50–51, 53, 55; 430/4–5, 430/30

See application file for complete search history.

(56) References Cited

U.S. PATENT DOCUMENTS

2003/0151003 A1  8/2003  Ogasawara
2005/0221204 A1  10/2005  Kimura

FOREIGN PATENT DOCUMENTS

| JP | 2003-133209 | 5/2003 |
| JP | 2003-303768 | 10/2003 |
| JP | 2005-195787 | 7/2005 |

OTHER PUBLICATIONS

U.S. Appl. No. 12/846,215, filed Jul. 29, 2010, Kato.
Office Action issued Oct. 28, 2010, in Taiwan Patent Application No. 095128147 (with English-language Translation).

*Primary Examiner* — Stacy Whitmore
(74) *Attorney, Agent, or Firm* — Oblon, Spivak, McClelland, Maier & Neustadt, L.L.P.

(57) ABSTRACT

A beam dose computing method includes specifying a matrix of rows and columns of regions as divided from a surface area of a target object to include first, second and third regions of different sizes, the third regions being less in size than the first and second regions, determining first corrected doses of a charged particle beam for correcting fogging effects in the first regions, determining corrected size values for correcting pattern line width deviations occurring due to loading effects in the second regions, using said corrected size values in said second regions to create a map of base doses of the beam in respective ones of said second regions, using said corrected size values to prepare a map of proximity effect correction coefficients in respective ones of said second regions, using the maps to determine second corrected doses of said beam for correction of proximity effects in said third regions, and using the first and second corrected doses to determine an actual beam dose at each position on the surface of said object.

6 Claims, 13 Drawing Sheets

BEAM DOSE COMPUTING METHOD AND WRITING METHOD AND RECORD CARRIER BODY AND WRITING APPARATUS

CROSS-REFERENCE TO RELATED APPLICATION(S)

This application is a continuation of and claims the benefit of priority under 35 U.S.C. §120 from U.S. Ser. No. 11/460,848, filed Jul. 28, 2006, which is in turn based upon, and claims the benefit of priority under 35 U.S.C. §119 from, Japanese Patent Application No. 2005-309247, filed Oct. 25, 2005, the entire contents of each of which are incorporated herein by reference.

FIELD OF THE INVENTION

The present invention relates generally to energy radiation lithography technologies and, more particularly, to a technique for determining through computation the optimal dose of a charged particle beam as used to draw or "write" a pattern on a target object to thereby increase the line-width uniformity or homogeneity of the pattern. This invention also relates to microlithographic apparatus and methodology using the beam dose computation technique.

DESCRIPTION OF RELATED ART

With further advances in miniaturization of highly integrated semiconductor devices, microlithography techniques for generation and depiction of extra-fine patterns are becoming important more and more. In recent years, semiconductor circuit devices decrease in minimum feature size of on-chip circuit patterns with an increase in integration density of ultralarge-scale integrated (ULSI) circuitry. To form a desired circuit pattern on substrates of such semiconductor devices, a high accuracy and ultrafine original image pattern, i.e., "master" pattern, is needed. This master pattern is called a reticle or photo-mask. Usually, this type of pattern is fabricated by using high-accuracy electron-beam photolithographic apparatus with enhanced image resolutions.

Currently available variable-shaped electron beam photolithography apparatus is typically made up of a movable stage structure which supports thereon a target object such as a workpiece, and a scanning electron beam pattern generation unit including an electron optics. This optics includes an electron beam irradiation source, a couple of spaced-apart aperture plates, and more than one deflector operatively associated therewith. Each aperture plate has a rectangular opening or hole as formed therein. The electron beam leaving the source is guided to first pass through the hole of the upper aperture plate and is then deflected by the deflector to reach the hole of the lower aperture plate. By this aperture, the beam is variable-shaped in cross-section and is then irradiated or "shot" onto the surface of a workpiece as placed on the stage. By adequate control of the scanning of the variable-shaped beam and the stage's continuous or discontinuous motions, it is possible to form or "write" a desired circuit pattern on the workpiece. In ultrafine lithography technologies, such scheme is called the "variable-shaped beam pattern writing" in some cases.

In electron beam pattern write processes, it is required to control the beam irradiation more precisely to thereby achieve excellent pattern line-width uniformity in the top surface of a target workpiece, such as a photomask or else. Unfortunately, it remains very difficult for the existing technology to completely prevent any undesired variations or fluctuations of line pattern sizes. For example, suppose that an electron beam is shot onto a mask with a photoresist film deposited thereon to thereby write a circuit pattern on its top surface. In this case, certain kind of line width size variations can occur, which is known as "proximity effect" among those skilled in the art to which the invention pertains. This is caused by the so-called back scattering, which takes place due to the electron beam's behavior which follows: after transmission of the resist film, the beam is reflected from its underlying layer to again enter the resist. This proximity effect-raised size variations would result in a decrease in accuracy of ultrafine depiction pattern having downscaled minimum feature sizes. Other occurrable size variations include the one occurring due to the so-called loading effect, which takes place during etching processes to be done after having depicted the pattern. This arises from the inherent difference in area density of line segments of a circuit pattern. This loading effect-based linewidth variations also affect the circuit pattern accuracy.

Attempts are made to reduce or avoid these proximity/loading effect-raised size variation risks. One approach to doing this is disclosed, for example, in JP-A-2005-195787. A technique as taught thereby is in summary for subdividing and partitioning the entirety of a circuit pattern into a plurality of size-different rectangular regions and for calculating an optimal beam dose on a per-region basis. An example is that these regions include "global" regions having each side edge of about 500 micrometers ($\mu m$) and "micro" regions with each side of 0.5 $\mu m$. For each of these regions, prepare a map of influence quantity or "influenceability." Then, specify a beam dose (fixed value) which guarantees the capability of optimally writing a circuit pattern having its area density of 50 percent (%) along with a proximity effect influenceability map and a loading effect correction quantity, which are used to create a map of proximity effect correction coefficients. Using this map, determine the dose of the pattern writing beam.

A further size variation risk that can lower the accuracy of ultrafine circuit pattern being written is the phenomenon known as "fogging" effect among technicians in the semiconductor lithography art. This is caused by multi-reflection of an irradiated electron beam at the surface of a mask. The above-identified Japanese patent document is silent about methodology for precluding size variations occurring due to the fog effect.

One of the currently challenged approaches is to perform size-different variation correction processing tasks with respect to "global" and "local" divided regions of a target mask. This is to apply the proximity effect correction to the local regions while applying to the global regions the fog effect correction that satisfies proximity effect correcting conditions or criteria. More specifically, compute a corrected relative beam dose on a per-region basis by use of the pattern area density, range of influence and fog effect correction coefficient (fixed value). Then, use an integrator to multiply together the relative dose for fog effect correction and the proximity effect-corrected dose, thereby to define a beam dose per region. The fog effect correction is based on the per-region relative dose, so pattern line-width variations occurring due to the loading effect are hardly correctable. This can be said because the loading effect does not rely on pattern categories. Accordingly, it is demanded to establish a beam dose computation technique or scheme capable of correcting pattern linewidth variations due to the three separate kinds of phenomena, i.e., the proximity, loading and fogging effects, at a time.

BRIEF SUMMARY OF THE INVENTION

In accordance with one aspect of this invention, a beam dose computation method includes the steps of specifying a matrix of rows and columns of regions as divided from a surface area of a target object to include first, second and third regions of different sizes, the third regions being less in size than the first and second regions, determining first corrected doses of a charged particle beam for correction of fogging effects in the first regions, and determining corrected size values for correcting pattern line width deviations occurring due to loading effects in the second regions. Then, use the corrected size values in the second regions to create a map of base doses of the beam in respective ones of the second regions. Use the corrected size values to prepare a map of proximity effect correction coefficients in respective ones of the second regions. Next, use the base dose map and the proximity effect correction coefficient map to determine second corrected doses of the beam for correction of proximity effects in the third regions. Then, by use of the first and second corrected doses, determine an actual beam dose at each position on the surface of the object.

In accordance with other aspects of the invention, a charged particle beam pattern forming or "writing" method using the above-stated beam dose computation method and a pattern writing apparatus employing the same are provided.

The apparatus includes a table-like structure which supports thereon a target object, a radiation source for emitting a charged particle beam, a pattern generator having more than one deflector and one or more apertures for guiding the beam toward the object to thereby permit writing of a pattern thereon, and a control unit connected to control the pattern generator. The control unit includes a first calculator which operates to specify a matrix of rows and columns of regions as divided from a surface area of a target object to include first, second and third regions of different sizes. The third regions are less in size than the first and second regions. The first calculator determines first corrected doses of a charged particle beam for correcting fogging effects in the first regions. The control unit also includes a second calculator for determining corrected size values for correcting pattern line width deviations occurring due to loading effects in the second regions, for creating using the corrected size values in the second regions a map of base doses of the beam and a map of proximity effect correction coefficients in respective ones of the second regions, and determining by using these maps second corrected doses of the beam for correction of proximity effects in the third regions. The control unit further includes a third calculator for determining by use of the first and second corrected doses an actual beam irradiation or "shooting" time at each location on the object surface, whereby the control unit controls the deflector to deflect the beam in accordance with the beam irradiation time thus determined.

BRIEF DESCRIPTION OF THE FIGURES OF THE DRAWING

FIGS. 14 and 15 are graphs for in-plane location distribution of measured line width values of area density-different patterns as formed on a workpiece, wherein FIG. 14 is in case the fog-effect linewidth correction is eliminated whereas FIG. 15 is in case this correction is executed.

DETAILED DESCRIPTION OF THE INVENTION

Figure 1:
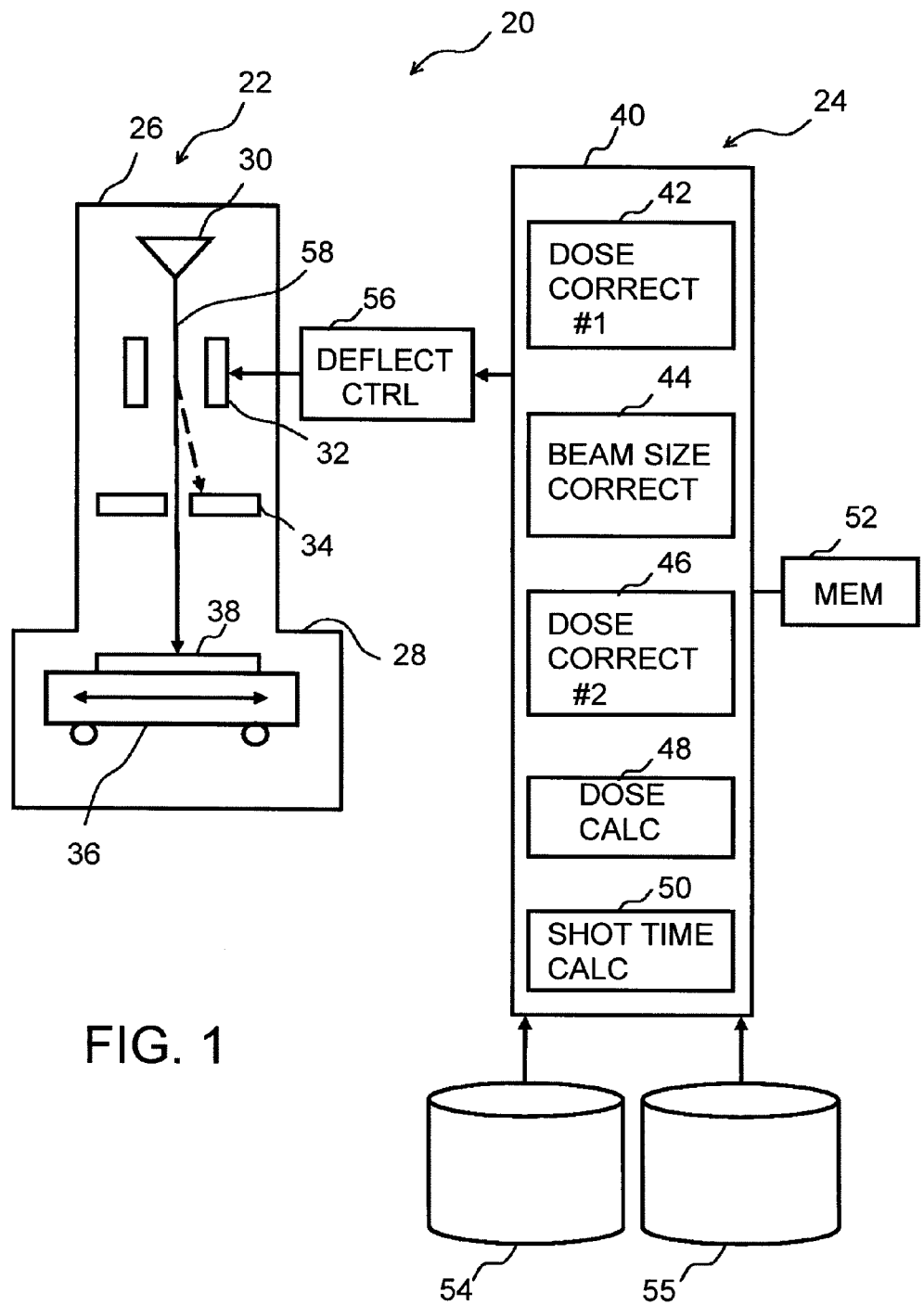
FIG. 1 is a diagram showing schematically an entire configuration of a variable-shaped electron beam pattern microlithographic apparatus in accordance with one embodiment of this invention.

A variable-shaped electron beam (EB) pattern lithography apparatus embodying the invention is shown in FIG. 1, with some main components thereof being illustrated therein. As shown in FIG. 1, this EB lithography apparatus is wholly indicated by reference numeral 20. EB lithography apparatus 20 is generally made up of a circuit pattern drawing or "writing" unit 22 and a control unit 24 which is operatively associated therewith.

The pattern write unit 22 includes a tower-like outer housing structure 26, called an electron lens barrel, and a processing chamber 28. Electron lens barrel 26 has a scanning electron beam pattern generation unit as built therein. This unit is constituted from a variable-shaped electron beam column, which includes an electron gun assembly 30, a blanking deflector 32, and a blanking aperture plate 34. In the process chamber 28, a table-like structure 36 is situated which is movable in two orthogonal axes that define a horizontal plane, i.e., X axis and Y axis. The table structure 36 will be referred to as "XY stage" hereinafter. This XY stage 36 supports on its top surface a workpiece 38 under pattern writing and is driven by a known actuator (not shown) to move continuously or discontinuously. Examples of the workpiece 38 include, but not limited to, a reticle, a wafer and a photomask which has an ultrafine circuit pattern(s) for use in the manufacture of ULSI semiconductor devices. The photomask may be a mask for exposure by using anyone of light, X-rays, EB, an ion beam and extreme ultraviolet (EUV) as a light source.

The control unit 24 includes a system controlling computer 40. This computer 40 includes several functional modules, including but not limited to a fogging effect-corrected beam dose calculator unit 42, a loading effect-corrected line size calculator 44, a proximity effect-corrected dose calculator 46, a dose calculator 48, and a beam irradiation time calculator 50. This calculator 50 functions to determine through computation a real time period for irradiation or "shooting" of a charged particle beam, e.g., electron beam. The system control computer 40 is connected or linked to operatively associate with a data storage unit 52.

This storage unit 52 may typically be a semiconductor memory device. Examples of it are a random access memory (ROM), an electrically erasable programmable read-only memory (EEPROM), flash memory or other functional equivalents thereto. Other examples of storage 52 include a hard disk drive (HDD), magnetic disk drive, magneto-optic (MO) disc drive, rewritable optical disc drive, digital versatile disc (DVD) drive, and any other similar suitable fixed or removable storage media. System computer 40 is physically coupled or communicably online-linked to receive two kinds of data blocks 54 and 55. One data block 54 is graphics image data of a circuit pattern(s) as input via a known data entry device (not shown). The other data 55 is the one that contains preset pattern drawing/writing conditions and various kinds of process parameters for use during correction processing sessions.

The system computer 40 is further connected to the above-noted blanking deflector 32 via a beam deflection control circuit 56, which may have a built-in signal amplifier (not shown). Under the control of computer 40, this deflection controller 56 controls the deflector 32 so that an electron beam 58 as emitted from the electron gun 30 is guided and deflected to reach each target location of the workpiece 38 being placed on movable XY stage 36, resulting in a desired circuit pattern being depicted or "written" thereon. Note here that the above-stated various types of calculator units 42 to 50 are configurable from hardware, such as electrical or electronic circuits. These hardware components may alternatively be configured from a software program or firmware or any possible combination thereof. The software program is preinstalled in the storage 52 of FIG. 1 or any other storage media or record carrier bodies that are functionally equivalent thereto.

The electron beam 58 leaving the electron gun 30 is controlled so that its current density J is at a specified value. This beam 58 is deflected by the blanking deflector 32 under the control of deflection controller 56 in co-work with system computer 40 to pass through the hole of the blanking aperture plate 34 and then fall onto a desired location of the target workpiece 38 on XY stage 36. When an irradiation or "beam shoot" time has elapsed which permits the real beam dose on workpiece 38 to reach a prespecified level, in order to prevent excessive beam irradiation, the blanking deflector 32 deflects the electron beam while the blanking aperture plate 34 interrupts or "cuts off" the travelling of the beam to ensure that this beam no longer reaches the workpiece 38. A deflection voltage of such deflector 32 is appropriately adjustable by the deflection controller 56.

Within a time period for allowing beam irradiation (called the "beam ON" period), that is, while the blanking function is turned off, the output electron beam 58 of the electron gun 30 travels downwardly and almost vertically along an orbit indicated by solid line in FIG. 1. On the contrary, within another time period for refusing beam shoot (called the "beam OFF" period), that is, while the blanking function turns on, the electron beam 58 obliquely progresses along an angled or "tilted" orbit indicated by dotted line in FIG. 1 and thus is prevented by the blanking aperture plate 34 from further going ahead. Thus this beam does not reach the workpiece 38 which lies under the aperture plate 34.

Figure 2:
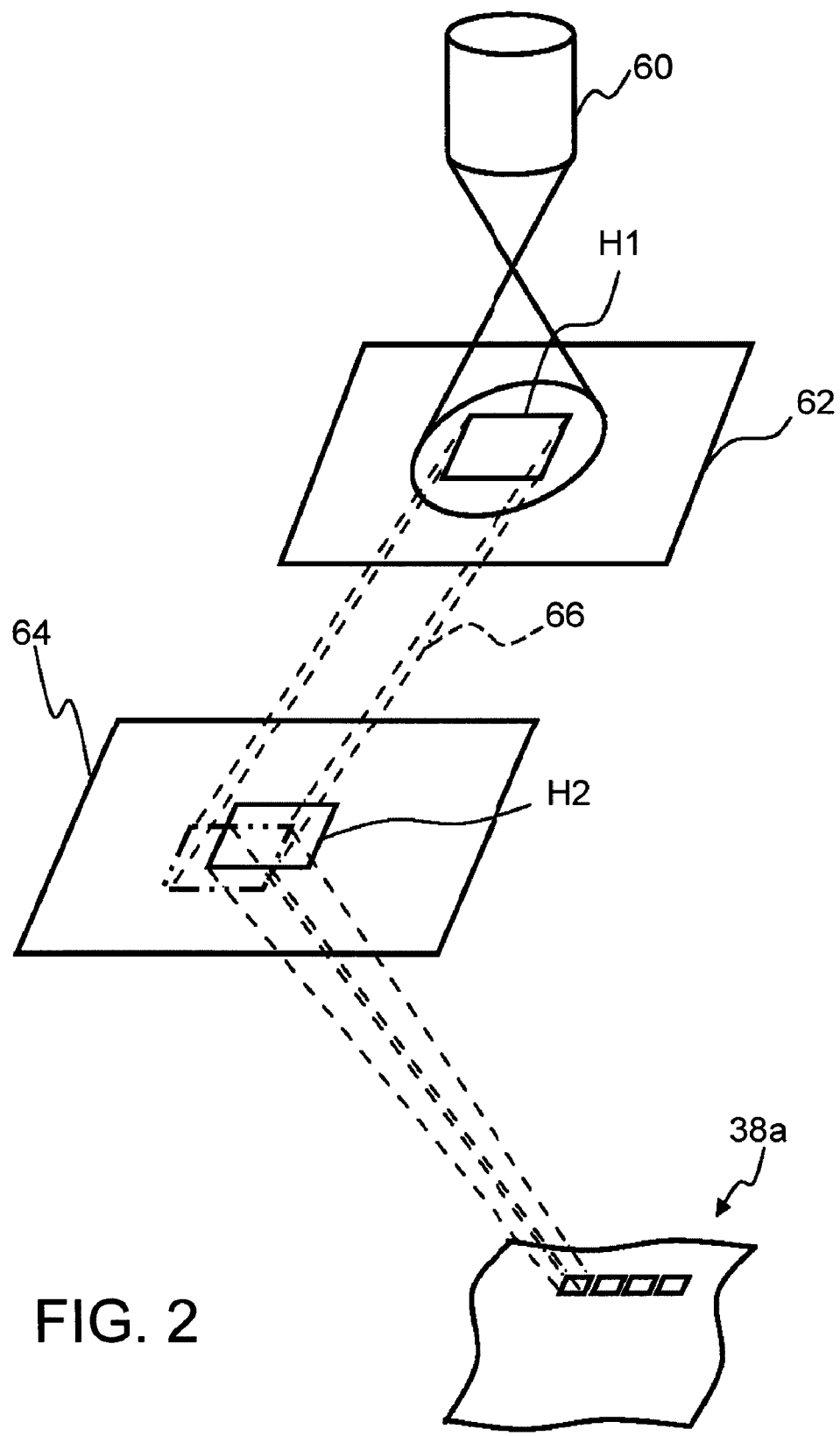
FIG. 2 is a pictorial representation of a perspective view of an electron optics as employed in standard variable-shaped electron beam lithography apparatus.

The electron optics within the barrel 26 shown in FIG. 1 is also modifiable in structure such as shown in FIG. 2. A variable-shaped beam pattern generation system as shown herein includes a charged particle source 60, which may be an electron gun assembly. This system also includes a couple of vertically spaced-apart aperture plates 62 and 64. An electron beam 66 as output from the source 60 is guided to travel through a known illumination lens (not shown) and then arrive at the upper aperture 62. Then, the beam passes through known projection lens and beam shaping deflector (each not shown) and arrives at the lower aperture 64. Next, the resulting beam that is shaped in cross-section by the hole H1 of aperture 64 is guided by an objective lens and objective deflector (not shown) to fall onto a target workpiece 38a.

During the "beam ON" (i.e., blanking OFF) session, the electron beam leaving the gun 60 is guided to irradiate or "illuminate" a surface area of the upper aperture 62 which includes its rectangular hole H1. Passing through hole H1 results in the beam being shaped to have a rectangular cross-sectional image. Resultant shaped beam 66 that passed through this aperture hole H1 is projected onto the lower aperture 64 via the projection lens. A beam projection position on this aperture is controlled by the shaping deflector so that the beam is adequately changed both in shape and in size. The beam leaving the lower shaping aperture 64 is focussed by the objective lens and deflected by the objective deflector, whereby a focused beam spot is formed at a target position on workpiece 38a. In this electron beam lithography process, beam size variations or fluctuations can occur due to the proximity, fogging and loading effects, resulting in degradation of the uniformity of miniaturized line widths on the workpiece surface, as has been discussed in the introductory part of the description.

Figure 3:
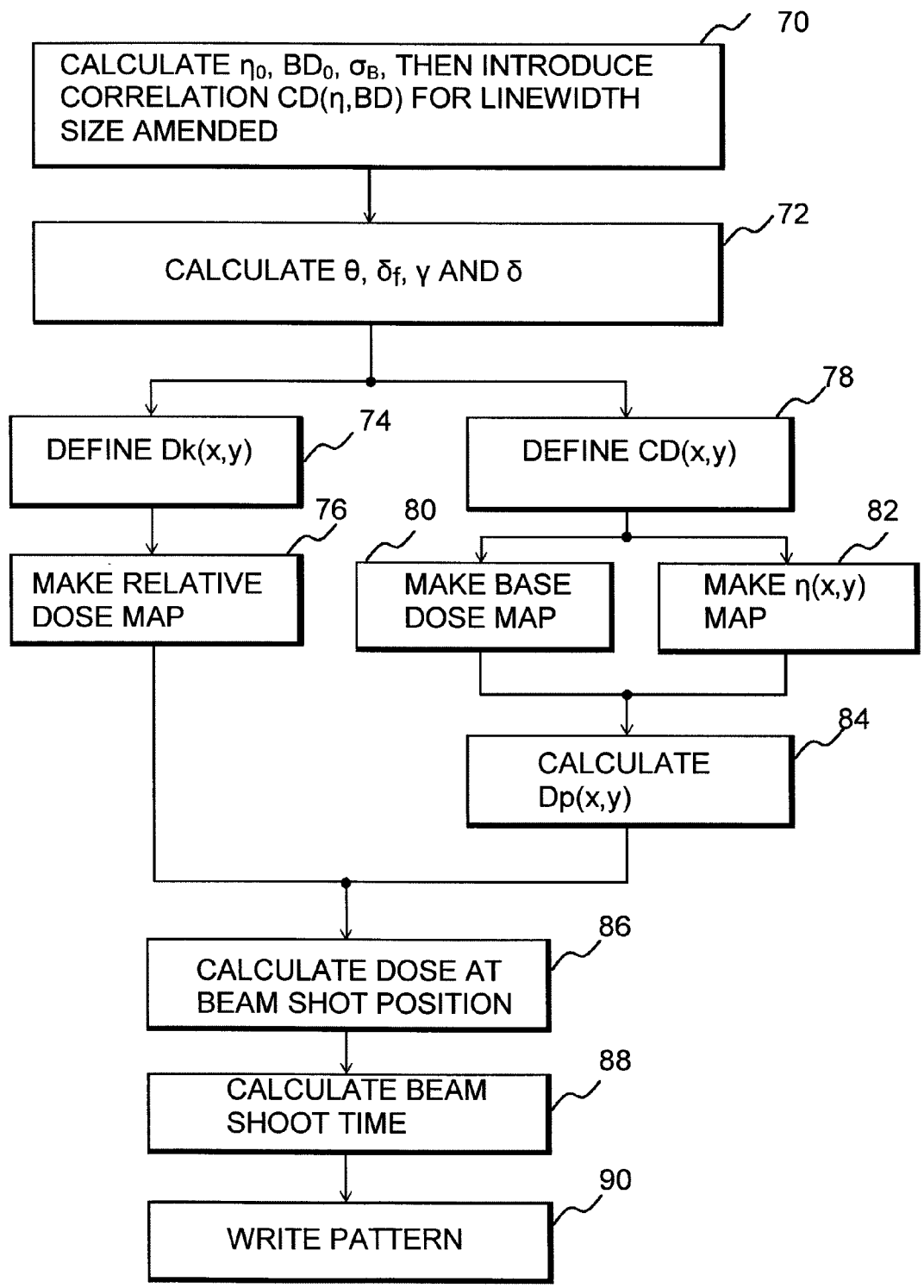
FIG. 3 is a flow diagram of a per-region beam dose computing method for use in the apparatus shown in FIG. 1.

A system control procedure for restraining or minimizing such beam size variations occurring during the pattern writing process of the EB lithography apparatus 20 is shown in FIG. 3 in flowchart form. The illustrative system procedure starts with step 70, which performs derivation of a standard proximity effect correction coefficient $\eta_0$, reference or "base" dose $BD_0$, influence range $\sigma_B$, and correlation of the proximity effect correction coefficient $\eta$ and base dose BD relative to a corrected line width size CD, as indicated by CD($\eta$,BD).

Figure 4:
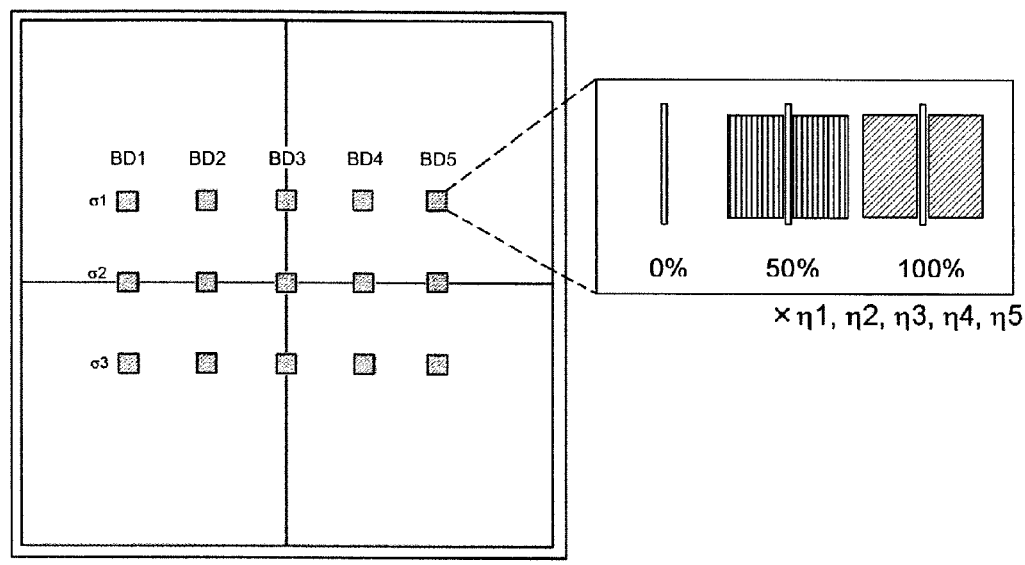
FIG. 4 shows a modelized plan view of a mask which is subjected to calculation of various numerical values in the method of FIG. 3.

More specifically, as shown in FIG. 4, a matrix or "mesh" of rows and columns of unit pattern elements is formed on a mask by electron lithography. Each unit pattern has some groups of line segments, which are different in pattern area density $\rho$ from each other. For example, a unit pattern has a set of line segments with a pattern area density $\rho$ of approximately 50 percent (%), a line group with its area density $\rho$ of 50% and a line group with $\rho$=100%. On-mask circuit pattern writing is actually performed while changing the standard proximity effect correction coefficient $\eta$, base dose BD and influence range $\sigma_B$ to various values. Then, for the real patterns thus formed or "written" on the mask, measure respective pattern line widths with the pattern area density $\rho$=0, 50, 100%.

Figure 5:
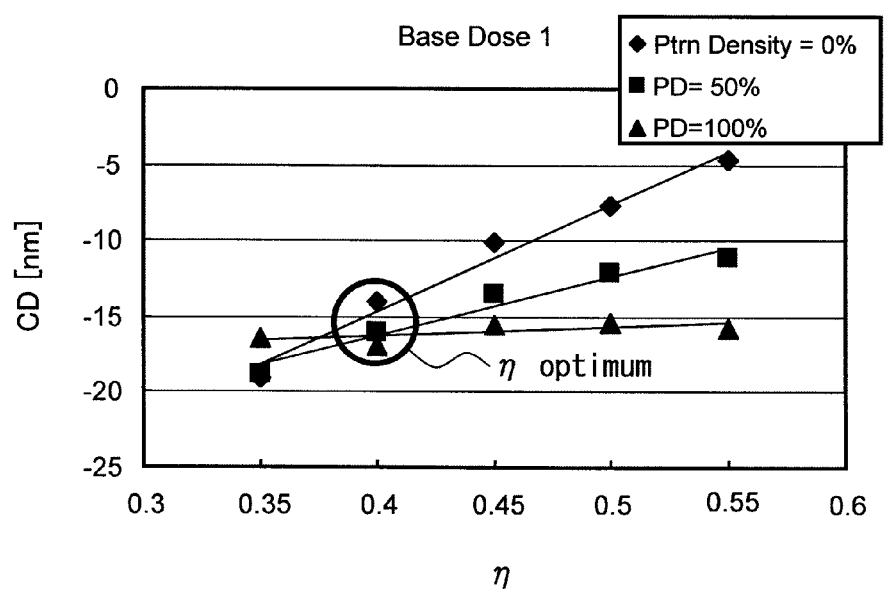
FIGS. 5A and 5B are graphs each showing exemplary measured plots of corrected line width size versus proximity effect correction coefficient at different pattern area densities.
Figure 5B:
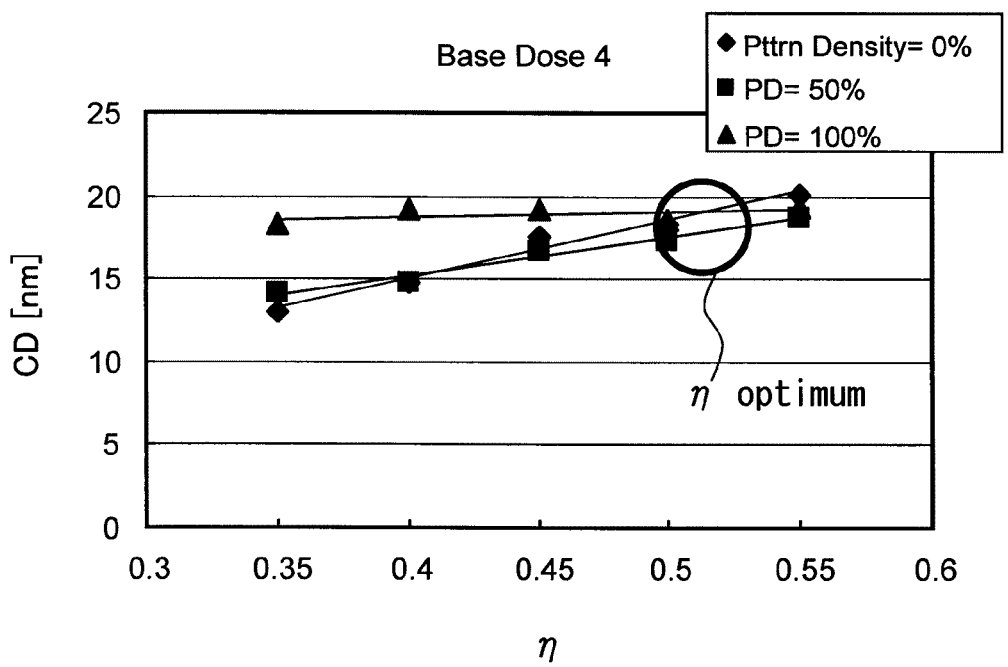

See FIGS. 5A and 5B, each of which is a graph showing plots of measured line-width values versus proximity effect correction coefficient $\eta$ in the case of beam pattern writing with different base doses. In each graph, rhombus plot points indicate measurement values of linewidths of line patterns with their pattern area density ρ is 0%; square points are measured pattern linewidth values with the pattern area density ρ of 50%; and, triangles are those of patterns with ρ=100%. Based on the measurement data, specify the value of a proximity effect correction coefficient η when a difference becomes minimized between these linewidth values at different pattern area densities p. Determine this value to be a combination of optimal proximity effect correction coefficient η and base dose BD which satisfy the proximity-effect correction condition. In this example, five separate combinations of such optimum proximity effect correction coefficient and base dose are calculated per influence range. An influence range at this time—that is, a range with the linewidth difference of patterns with ρ=0, 50 and 100%—is determined to be the optimum influence range $\sigma_B$. Then, perform interpolation based on these optimum proximity effect correction coefficient and base dose plus optimum influence range along with the five sets of linewidths at this time in a way such that the optimum proximity-effect correction condition and base dose plus linewidth value are in a continuous correlation. Next, extract a specific combination of proximity-effect correction condition and base dose from among those residing on the resulting continuous correlation line. This is identical in value to an iso-focal dose in one-to-one corresponding line patterns with the pattern area density ρ of 50%. Define this extracted combination as a recommended or "ideal" combination C0 of standard proximity effect correction coefficient $\eta_0$ and standard base dose $BD_0$.

Figure 6:
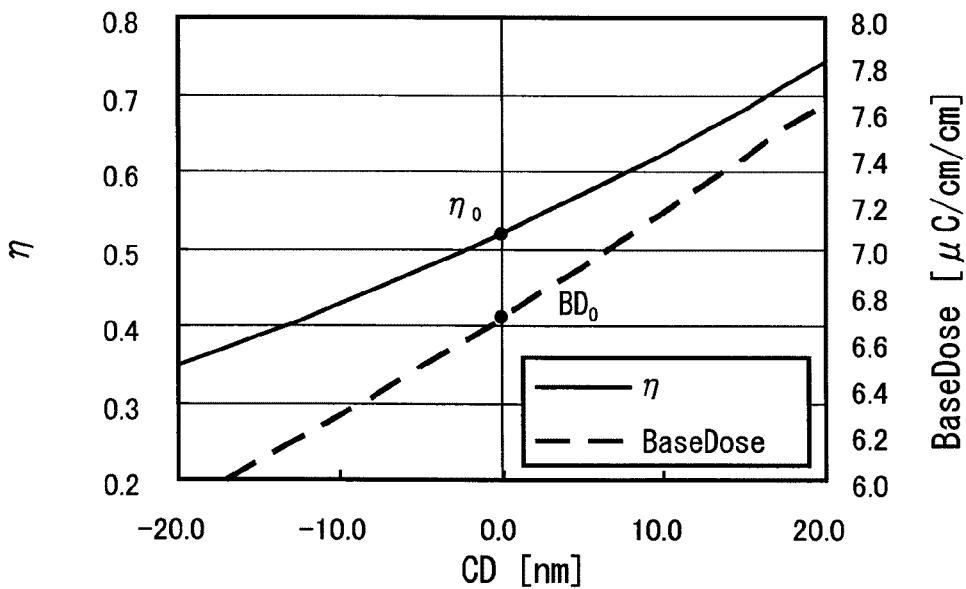
FIG. 6 is a graph showing curves of standard proximity-effect correction coefficient $\eta_0$ and reference or "base" dose $BD_0$ relative to corrected line width size CD.

Two typical curves of a change of line width CD, i.e., corrected line-width size correlation CD(η,BD), are shown in a graph of FIG. 6. A change curve indicated by solid line is a linewidth change when the value of proximity effect correction coefficient η is varied along a correlation continuous line, which is obtained by execution of interpolation with the above-noted combination C0 of standard proximity effect correction coefficient $\eta_0$ and standard base dose $BD_0$ and a pattern linewidth value at this time being as a center thereof. Curve of dotted line is when the base dose BD is changed in value along the correlation line. Based on this correlation dependency, the linewidth size is changeable while satisfying the proximity-effect correction condition.

Figure 7:
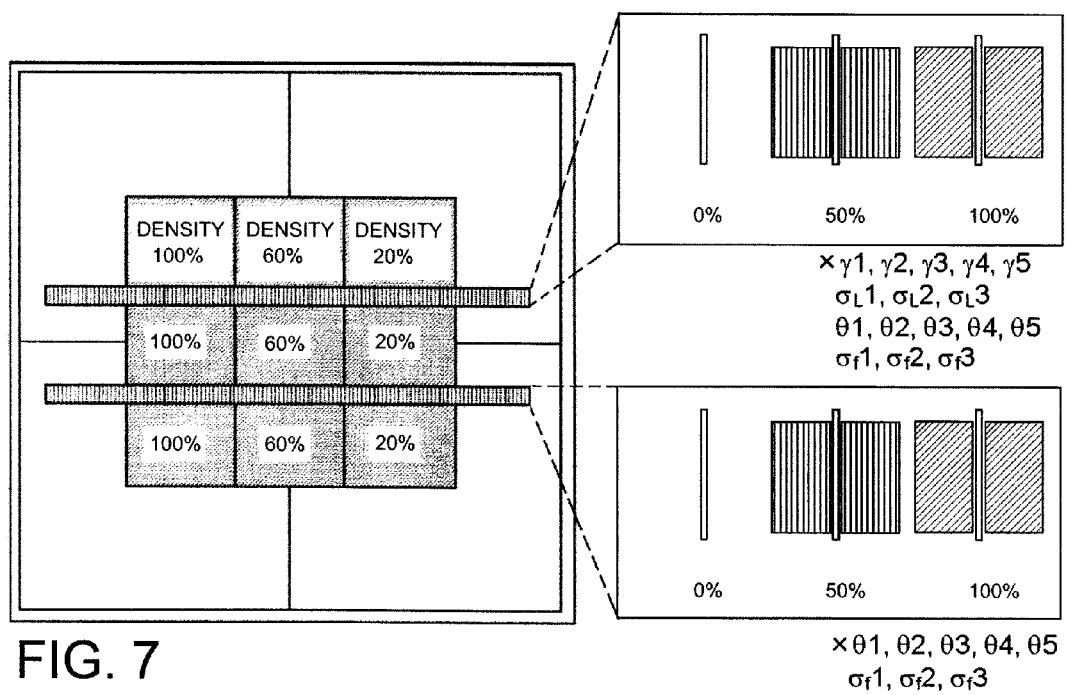
FIG. 7 is a modelized plan view of various unit regions on the top surface of a mask as used during calculation of fog-effect and loading-effect correction coefficients.

Turning to FIG. 3, the procedure goes next to step 72 which calculates a fogging-effect correction coefficient θ, influence range $\sigma_f$, loading-effect correction coefficient γ and influence range $\sigma_L$. More specifically, as shown in FIG. 7, form on a mask a layout of several columns of pattern groups which are different in pattern area density ρ from each other. In this example, it is a matrix, sometimes called the "mesh," including a column of pattern units with the pattern area density ρ is 20%, a column of ρ=60% unit patterns, and a column of ρ=100 patterns. A linear array of line pattern segments having ρ=0%, 50% and 100% is formed by beam writing between each row of ρ=20%, 60% and 100% patterns and its neighboring row. Here, two line pattern arrays are formed among three rows. This pattern writing is performed with the fog-effect correction coefficient θ, fog-effect influence range $\sigma_f$, loading-effect correction coefficient γ and loading-effect influence range $\sigma_L$ being as parameters based on fog and loading effects in the existing mask fabrication processes and their respective correction degrees as defined for each column of ρ=20%, 60%, 100% patterns. After having developed and etched these respective line pattern arrays thus formed, measure their actual line widths. Measurement results are used to determine whether the intended correction brings expected results. If desired correction was done then specify the real values of fog-effect correction coefficient θ, fog-effect influence range $\sigma_f$, loading-effect correction coefficient γ and its influence range $\sigma_L$ in this event.

The calculation processing at the steps 70 and 72 is completed prior to execution of the pattern writing in the actual mask fabrication. The various kinds of calculated values are sent to the EB lithography apparatus 20 shown in FIG. 1 in the form of data 55 indicative of correction conditions and coefficients needed for correction and are then stored in the memory 52. The system control computer 40 provides access to this memory when a need arises for reading or "loading" these data. In responding to receipt of a set of input image data 54 indicating a circuit pattern to be depicted, the system computer 40 stores it in memory 52. Using this data set, the circuit pattern is depicted or "written" on the workpiece 38.

Figure 8:
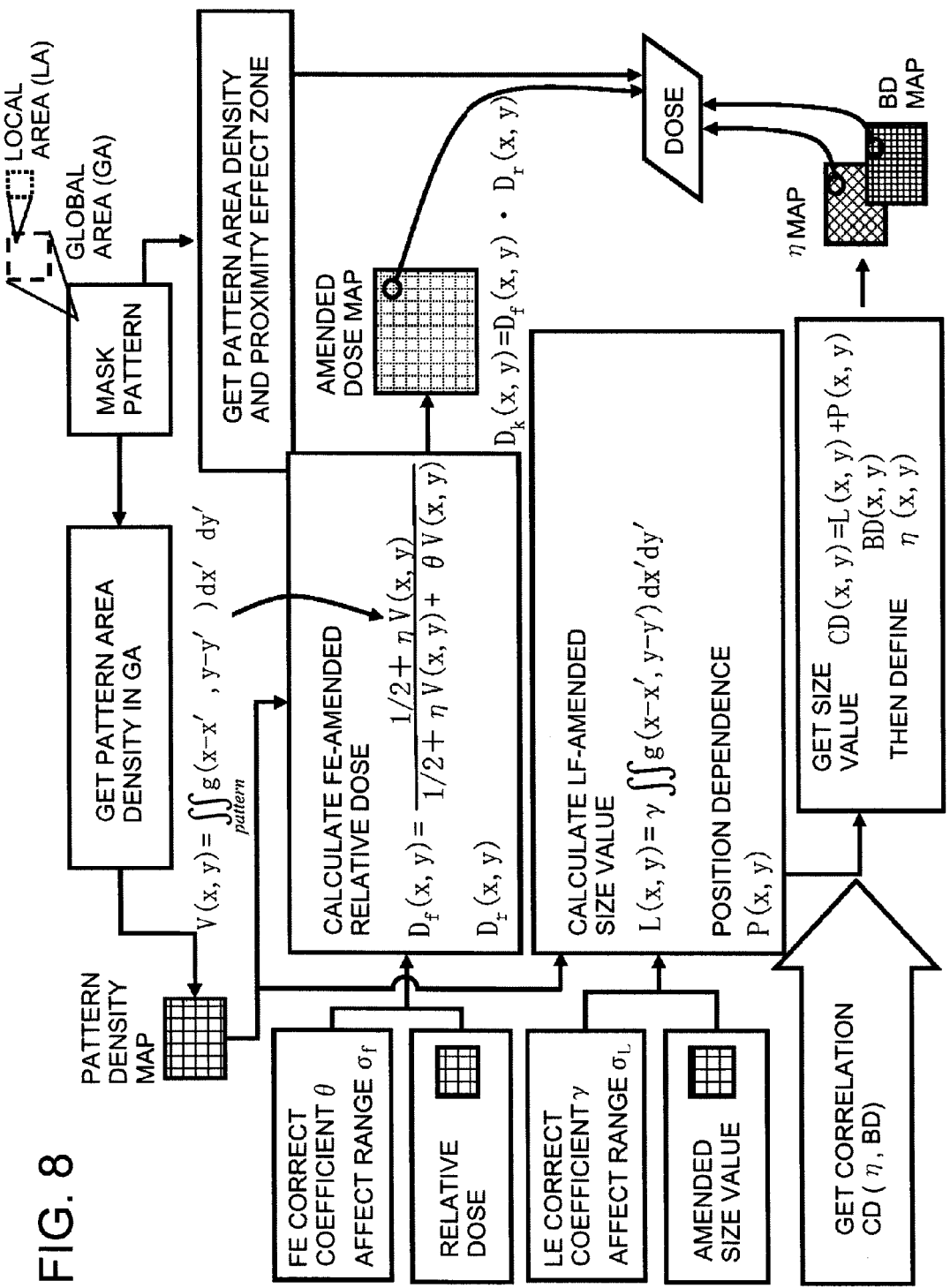
FIG. 8 illustrates, in process map form, a flow of processes for correction of pattern line width variations occurring due to several kinds of effects in beam dose computation methodology embodying the invention.

Subsequently, the procedure of FIG. 3 enters a processing stage relating to electron beam dose calculation. A computation routine thereof is shown in FIG. 8 in so-called process-flow map form. Firstly, divide or partition a mask pattern depiction region into several size-different sub-regions which are organized into a matrix form. This subregion matrix is called the "mesh-like" layout in some cases. These divided subregions include at least three types of small rectangular regions with each side edge having a length on the order of magnitude ranging from micrometers to millimeters. The first small regions are square "tile-like" region with each side being 0.5 to 1.0 mm long, as an example. These are unit regions for correction of undesired pattern size variations occurring due to the above-stated fog effect and will be referred as "global" regions hereinafter. The second regions are tile-like regions as cut out or "diced" so that each side length measures 0.5 to 1.0 mm. These are unit regions for correction of pattern size deviations occurrable due to the loading effect. These regions are also global regions. In other words, two types of global regions of substantially the same size as used for correction of fogging and loading effects are defined, although these regions may be defined to different in size from each other. Third subregions are less in side length than the global regions. Typically these are "tiles" with each side length of 1 μm or less. These are unit regions for proximity effect correction and will be referred to hereafter as "local" regions.

Next, the procedure proceeds to step 74, which causes the calculator 42 of FIG. 1 to calculate the value of a fog effect-corrected relative dose. More specifically, compute a fog effect-corrected relative beam dose Dk(x,y) for correction of the fog effect with respect to each of the above-stated fog/loading effect-correcting global regions. To do this, first calculate fog correction data V(x,y) in each unit region as shown in FIG. 8. Here, V(x,y) is defined by Equation 1, which follows:

$$V(x, y) = \int\int_{pattern} g(x - x', y - y')dx'dy' \quad (1)$$

where, g(x,y) is the distribution coefficient of the fogging effect. This coefficient is approximated by the Gaussian distribution of the fog-effect influence range $\sigma_f$, which is equivalent to the radius of scattering or dispersion. This approximation is represented by:

$$g(x, y) = \frac{1}{\pi\sigma^2}\exp\left[\frac{-(x^2 + y^2)}{\sigma^2}\right] \quad (2)$$

The radius of beam scattering occurring due to the fog effect is on the order of magnitude of centimeters. Letting the fogging/loading effect correcting global regions be set to one-tenth or less of the fog effect-based dispersion radius, V(x,y) is obtained by Equation 3 below:

$$V(x, y) = \sum_j \sum_i \frac{\rho(x_i, y_j)}{\pi\sigma_f^2}\exp\left[\frac{-(x - x_i)^2 - (y - y_j)^2}{\sigma_f^2}\right] S_{mesh} \quad (3)$$

where, ρ(x,y) is the pattern area density of each unit region, and $S_{mesh}$ is the area of unit region. In case the global regions for fog-effect correction and the loading effect-correcting global regions are different in area density from each other, calculate the value of ρ(x,y) separately for respective ones.

Figure 9:
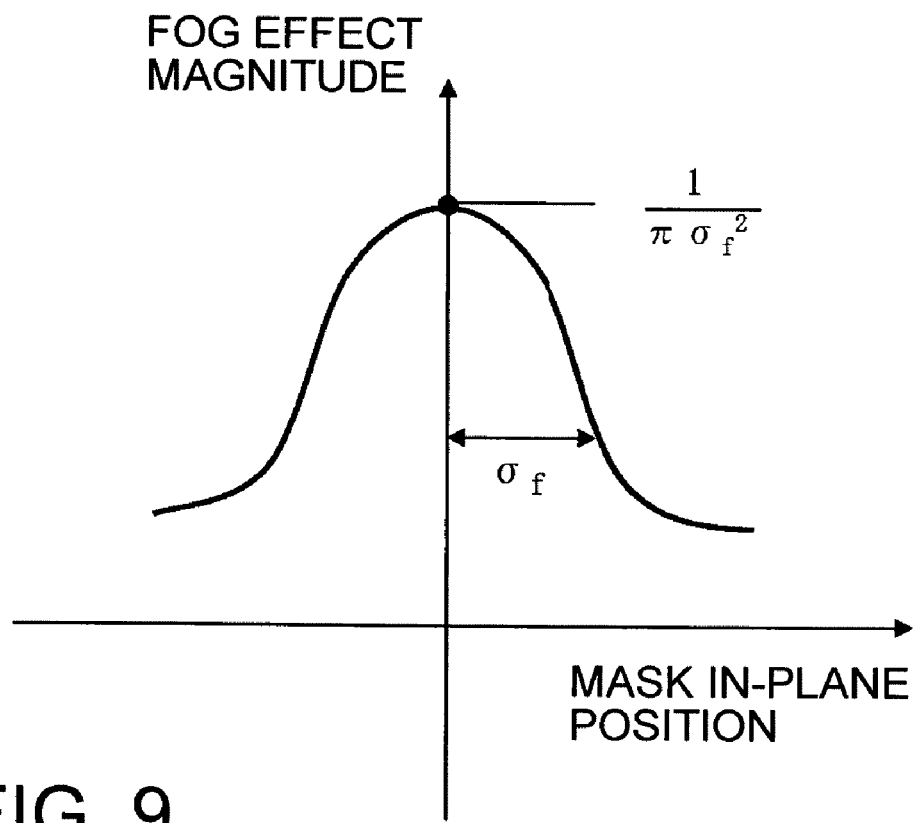
FIG. 9 is a graph showing one typical change of the magnitude of fog effect with respect to locations in the surface plane of a mask.

As shown in a graph of FIG. 9, the fog-effect distribution function g(x,y) generally exhibits a curve of Gaussian distribution. More precisely, the function g(x,y) is definable as a Gaussian distribution curve of fog-effect influence range $\sigma_f$ in a certain direction, e.g., "x" axis direction. Letting a mask in-plane coordinate position be x', the magnitude of the fog effect, Mfe, becomes maximal at x'=0. Its maximum value is $1/\pi\cdot\rho_f^2$. If x' is of infinity, the Mfe value is zeroed.

The fog effect-corrected relative beam dose Dk(x,y) is variable in value in a way depending upon the relative value V(x,y) indicating the pattern area densities of the global regions for fog/loading-effect correction and mask in-plane position Pm(x,y) of these regions. Let the dependency of the former be given as Df(x,y) whereas let the dependency of the latter be Dr(x,y). As shown in FIG. 8, the relative pattern area density dependency value Df(x,y) is for determination of the fog effect-correcting relative beam dose that is dependent on the pattern area density, and is obtainable by the mask inplane position-dependent distribution function based on the pattern area density V(x,y), fog-effect correction coefficient θ, and proximity effect correction coefficient η.

Figure 10:
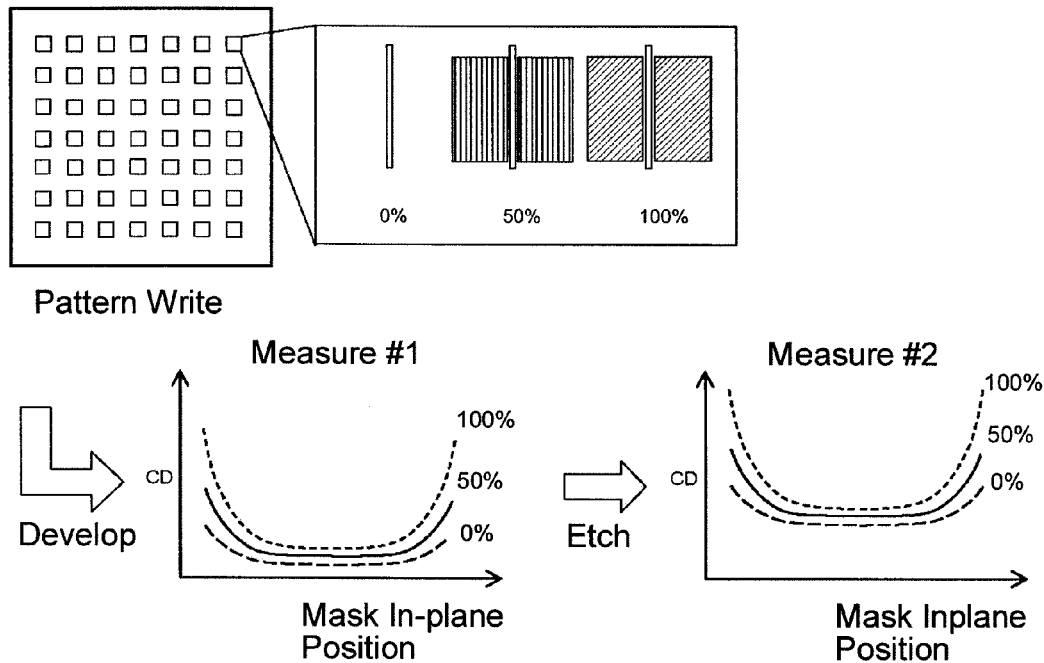
FIG. 10 shows a flow of major processes of a scheme for measuring fogging and loading effects which are variable in magnitude depending upon mask in-plane locations.

The mask inplane position dependence value Dr(x,y) is for determining the fog effect-correcting relative beam dose Dr(x,y) that is dependent on a mask inplane position. This value Dr(x,y) is obtained through actual measurement using more than one standard workpiece or "sample," which is prepared in advance. An exemplary scheme for doing this is shown in FIG. 10. To obtain by measurement the mask inplane position-dependent fogging/loading effects, a mask sample is first prepared. This mask has a transparent dielectric substrate made for example of quartz or else and a multilayer structure of a light shield film made of chromium (Cr) and a photoresist material film. The mask has its top surface, on which an ensemble of global regions for fogging/loading effect correction are defined. Apply electron beam lithography to the global regions, thereby to form therein a matrix of rows and columns of test pattern image elements. Each element has a group of line pattern segments with their area density ρ of about 0%, a line pattern group with ρ=50%, and a line pattern group of ρ=100%.

After having developed this mask sample, measure the real line width values thereof (first measurement). Then, pattern the resist film. With the patterned resist film as a mask, etch the sample to thereby form a corresponding set of line patterns in its underlying Cr film. Subsequently, measure the line width size CD thereof (second measurement). Usually, a difference takes place between the line-width sizes CD at different pattern area densities as obtained by the first measurement. The difference is dependent on mask inplane positions thereof. To correct or "amend" this linewidth size difference, a need is felt to appropriately adjust the relative dose of an electron beam that hits the mask surface in accordance with the mask inplane position. Let this relative beam dose for correction of the linewidth difference be the mask inplane position-dependent relative value Dr(x,y), i.e., fog effect-corrected relative dose. Next, subtract the value of linewidth size CD as measured per pattern element in the first measurement from its corresponding measured value obtained in the second measurement. Let the resulting difference value be a loading effect correction size value P(x,y) with mask inplane position dependency. While the fog effect-corrected relative dose Dr(x,y) is a numerical value per pattern element, this may be made more precise by applying interpolation thereto for conversion to a value per fog/loading-effect unit region.

Then, obtain through calculation a product of the pattern area density-dependent fog effect-corrected relative dose Df(x,y) and mask inplane position-dependent fog effect-corrected relative dose Dr(x,y). Calculate this product for each of the unit regions. Let it be per-region fog effect-corrected relative dose Dk(x,y). By co-use of the pattern density-dependent relative value and the mask inplane position-dependent relative value, the fog effect-corrected relative dose increases in numerical precision.

Turning again to FIG. 3, the procedure goes next to step 76. At this step, the calculator 42 of FIG. 1 creates a map indicative of the per-region distribution of those values of the fog effect-corrected relative dose Dk(x,y) in respective unit regions, which values have been obtained at the previous step 74. This Dk map is stored in the memory 52 shown in FIG. 1.

At step 78, another calculator 44 in the system control computer 40 is rendered operative to determine by calculation pattern linewidth size values that are loading effect-corrected. This calculation is executed in a way parallel with the above-stated processing of calculator 42 at steps 74-76. More specifically, calculator 44 calculates a correction size value CD(x,y) for correction of pattern linewidth size variations occurring due to the loading effect in the above-noted global regions, which are partitioned in the mask pattern depiction area. This value CD(x,y) is variable depending upon a pattern area density-dependent corrected linewidth size value L(x,y) in the global regions and corrected size value P(x,y) that is dependent on the mask inplane location in these regions. That is, the correction size value CD(x,y) is calculated by the sum of the corrected size value L(x,y) and the corrected size value P(x,y).

As shown in FIG. 8, the pattern area density-dependent corrected linewidth size value L(x,y) for the loading effect correction is obtained by Equation 4 which follows:

$$L(x, y) = \gamma \int\int_{pattern} g(x - x', y - y')dx'dy' \quad (4)$$

where, γ is loading effect correction coefficient. And g(x,y) is distribution functions of the loading effect. The g(x,y) value is approximated by the Gaussian distribution curve of the radius of influenceability of the loading effect (i.e., influence range) $\sigma_L$, which is given by Equation 2 presented previously. This radius is on the order of magnitude of centimeters. When setting the individual global region for use as a unit region for the fogging/loading effect-correction so that it is a tenth or less of this loading effect radius $\sigma_L$, the value of L(x,y) is obtained by:

$$L(x, y) = \gamma \sum_j \sum_i \frac{\rho(x_i, y_j)}{\pi \sigma_L^2} \exp\left[\frac{-(x-x_i)^2 - (y-y_j)^2}{\sigma_L^2}\right] S_{mesh} \quad (5)$$

Figure 11:
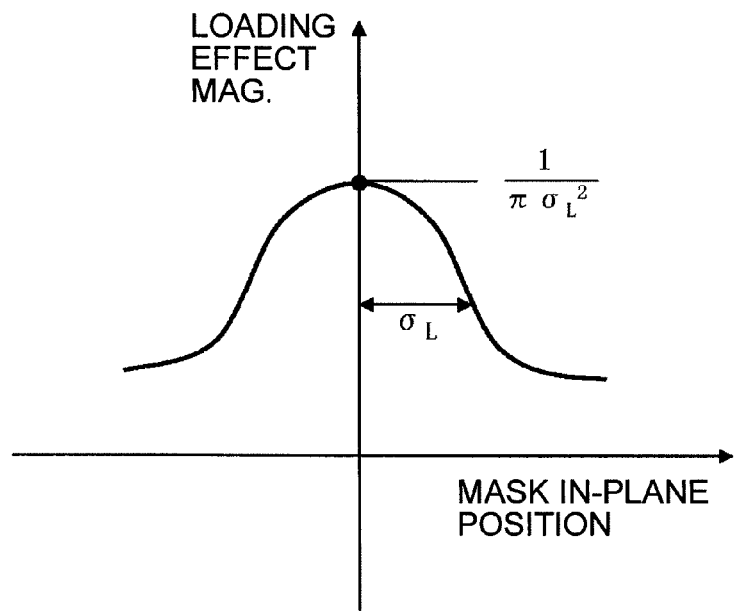
FIG. 11 graphically shows an exemplary distribution curve of the magnitude of loading effect versus mask inplane location.

Here, $\rho(x,y)$ is the pattern area density of each unit region, $S_{mesh}$ is the area of "meshed" unit area. An exemplary Gaussian distribution curve of the influence range $\sigma_L$ is shown in FIG. 11. This curve is similar to that shown in FIG. 9 with a maximal value of this distribution being given by $1/\pi \cdot \rho_L^2$.

Regarding the position-dependent loading effect-corrected pattern linewidth size value P(x,y), determine it by numerical measurement using a sample(s). A scheme for doing this is generally similar to that for the above-stated fog effect-correcting relative beam dose Dr(x,y). When a need arises, it is permissible to add to this loading effect-corrected pattern linewidth size value P(x,y) in unit region a value for correction of size variations occurring due to phenomena other than the loading effect. This is a size value for compensation of mask inplane irregularities occurrable during some processes other than the etching treatment. An example of this value is a value that corrects pattern size deviations caused by development irregularities during development processes.

In step 80 of FIG. 3, the calculator 44 creates a numeric map of base dose BD values of the electron beam 58. This base dose map is prepared in a form of one-to-one correspondence to respective fog/loading effect correcting unit regions (global regions). Creation of this map is done based on the loading effect-corrected size value CD(x,y) in each unit region. Specifically, the correlation CD($\eta$,BD) shown in FIG. 6 is used to obtain the base dose BD(x,y) that corresponds to the corrected size value CD(x,y) for creation of the map. The resulting base dose map is sent forth in digital data form toward the memory 52 of FIG. 1 and then stored therein.

At step 82 the calculator 44 also functions to create a numeric map of proximity effect correction coefficient $\eta$ values. This map also is prepared based on the loading effect-corrected size value CD(x,y) in each global region. Specifically, the correlation CD($\eta$,BD) of FIG. 6 is used to obtain the intended proximity effect correction coefficient $\eta$(x,y) corresponding to the corrected size value CD(x,y) to thereby make the map. A set of data indicating the resulting $\eta$ map is stored in the memory 52. As the base dose map and the proximity effect correction coefficient map are defined based on the $\eta$-BD correlation, it is possible to achieve linewidth variation correctabilities which remain substantially equivalent among any given circuit pattern categories.

In step 84 of FIG. 3, the dose calculator 46 as built in the system control computer 40 gives access to the memory 52 for reading therefrom the above-noted base dose map and proximity effect correction coefficient $\eta$ map. Use these maps to calculate on a per-region basis the fog effect-corrected dose Dp of the electron beam 58 for correction or "amendment" of the proximity effect in each unit region. A scheme for doing this is shown in FIG. 12.

Figure 12:
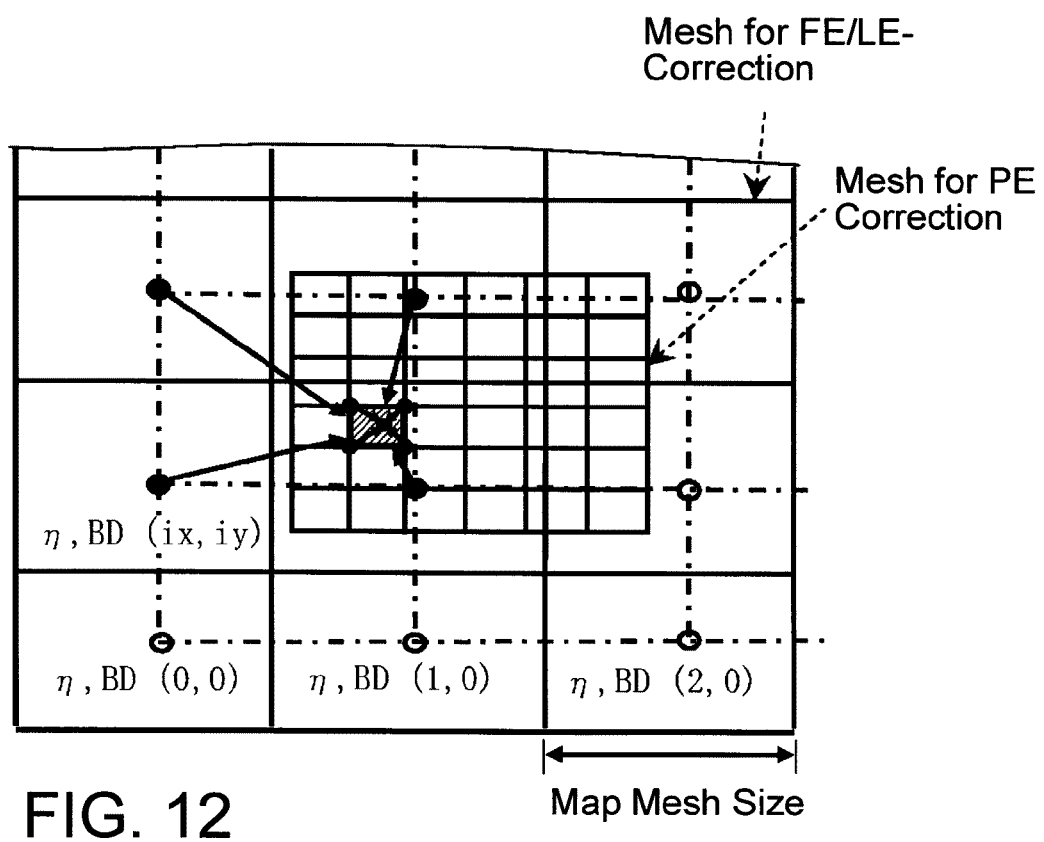
FIG. 12 is a diagram showing, in modelized form, a target unit region and its surrounding regions of a mask being subjected to proximity effect correction calculation.

As shown in FIG. 12, what is done first to obtain the per-unit region proximity effect-corrected dose Dp is to specify four separate unit regions which are around the single region of interest. These peripheral regions are called the "north," "south," "east" and "west" regions. Then, specify the base dose BD(x,y) and proximity effect correction coefficient $\eta$(ix,iy) of them, wherein "ix" and "iy" indicate X- and Y-axis coordinate values in each region. Using these values, perform interpolation calculation to thereby determine the base dose BD(x,y) and proximity effect correction coefficient $\eta$(x,y) of the region of interest per se. Similarly "x" and "y" are coordinates of each region. By use of the resultant BD(x,y) and $\eta$(x,y) values and the proximity-effect influence range $\sigma_B$, derive the per-unit region proximity effect-corrected beam dose Dp.

More precisely, the per-region proximity effect-corrected beam dose Dp is obtained by the following Equation:

$$D_P(x,y) = BD(x,y) \times (d_0 + d_1 + d_2 + d_3 + \ldots) \quad (6)$$

where, "d0" is given as:

$$d_0 = \frac{1/2 + \eta(x, y)}{1/2 + U(x, y) \times \eta(x, y)} \quad (7)$$

and, "$d_i$" (i=1, 2, 3, ...) is represented by:

$$d_i = \frac{\eta(x, y) \times d_0(x, y)}{1/2 + \eta(x, y)} [d_{i-1}(x, y) U(x, y) - V_i(x, y)], \, (i \geq 1) \quad (8)$$

U(x,y) in Equations 7-8 is zero-order proximity effect correction data (i>0) and is given by:

$$U(x, y) = \int\!\!\!\int_{pattern} g(x-x', y-y') dx' dy' \quad (9)$$

Additionally, $V_i$(x,y) is more than one-order or "primary" proximity effect correction data (i>1), which is given as:

$$V_i(x, y) = \int\!\!\!\int_{pattern} d_{i-1}(x', y') g(x-x', y-y') dy' dx' \quad (10)$$

Note that "(x',y')" in Equations 9-10 denotes a mask inplane position. As Equation 3 suggests, addition of more than one-order (i-order) proximity effect correction data $V_i$(x,y) results in an increase in accuracy of numerical dose computation. Accordingly, the per-region proximity effect-corrected dose Dp also increase in accuracy. The larger the "i" value, the greater the numeric accuracy. Simply increasing the "i" value excessively results in the system control computer 40 being required to offer more powerful processing abilities. This leads to increase in processing time with a limited level of computation performance. By taking account of such tradeoff, it is preferable to set i=3 in the EB lithography apparatus 20 for most practical applications. In this case, it is expected that possible computing errors be suppressed to fall within the range of about 0.5%.

Additionally, experimentation that was conducted by the inventors as named herein suggests that it is a must to change the base dose BD along with the proximity effect correction coefficient $\eta$ with respect to the corrected linewidth size CD in order to accomplish substantially the same pattern size for area density-different line pattern segments—that is, in order to satisfy the proximity effect correction conditions successfully. In this embodiment, more than two separate values on the base dose map are used as the beam variation correction value that guarantees appropriate depiction or "writing" of the intended microcircuit pattern(s), so it is possible to achieve beam dose calculation with increased precision. Note here that the above-stated per-unit region proximity effect-corrected beam dose Dp is effective not only for the proximity effect correction but also for correction of pattern linewidth variations occurring due to the loading effect.

After completion of the calculation of the per-region proximity effect-corrected beam dose Dp, calculate a proximity effect-corrected beam dose Dp(x,y) at a "real" beam irradiation position on the surface of workpiece 38. This dose value also is obtained by execution of interpolation processing using the proximity effect-corrected dose values in the "north (N)," "south (S)," "east (E)" and "west (W)" peripheral regions surrounding the real beam-shoot position in a similar way to that in the example of FIG. 12. To do this, Equation 2 presented previously is used to calculate zero-order proximity effect correction data U(x,y) and i-order proximity effect correction data Vi(x,y), where "i" is an integer.

Figure 13:
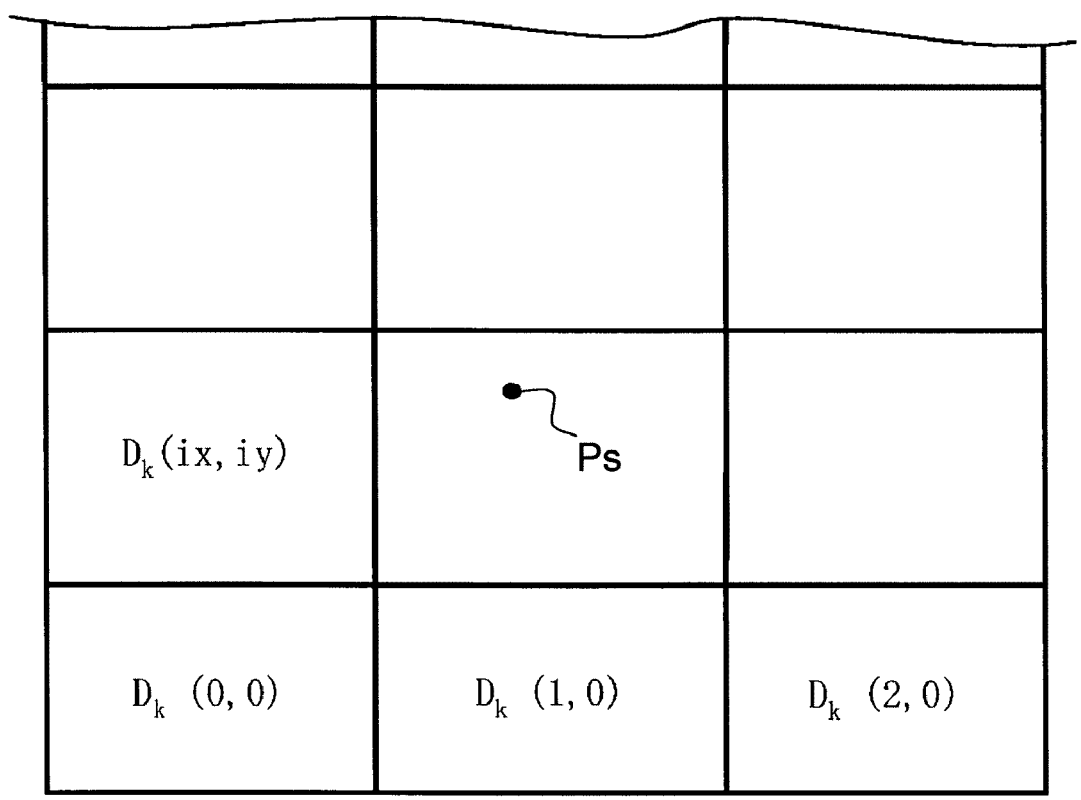
FIG. 13 is a model diagram showing a plan view of several unit regions as used in the event for on-mask electron beam dose calculation.

At step 86 of FIG. 3, the dose calculator 48 in system computer 40 calculates a dose at the actual beam shot position. More specifically, determine the dose Dk(x,y) of electron beam 58 based on the above-stated per-region fog effect-corrected relative dose Dk(x,y) and proximity effect-corrected beam dose Dp. A calculation technique thereof will be discussed with reference to FIG. 13. To obtain the dose D at the real beam spot position Ps, first specify a unit region which contains this position Ps. Then, identify four "N-S-E-W" regions around this region. Using respective fog effect-corrected relative dose Dk(ix,iy) of these regions, perform interpolation computation to thereby obtain the intended fog effect-corrected relative dose Dk(x,y) at the spot position Ps. As previously stated, "ix" and "iy" indicate X- and Y-axis coordinate values in a system of orthogonal coordinates of X and Y axes.

Next, multiply the resultant fog effect-corrected relative dose Dk(x,y) by the proximity effect-corrected beam dose Dp to obtain a product thereof. Let this product be the dose D. This computation will be recurrently repeatedly executed for respective beam shot positions, thereby calculating the dose D(x,y) at each position. In this way, the intended beam dose D(x,y) is defined which is capable of correcting or "amending" in unison a plurality of kinds of undesired deviations of ultrafine pattern line widths occurrable due to the fogging effect, proximity effect and loading effect.

Subsequently at step 88 of FIG. 3, the beam shoot time calculator 50 in system control computer 40 calculates an irradiation or "shoot" time of the electron beam 58 at each position in the pattern writing area of workpiece 38. This time value is obtainable by division of the dose D by the current density J of beam 58.

Next in step 90, the system computer 40 generates a control signal corresponding to the finally determined beam shoot time T, which is transferred to the deflection controller 56. In response to receipt of this signal, deflection controller 56 drives and controls the blanking deflector 32 in such a way as to deflect the electron beam 58 so that beam irradiation onto the workpiece 38 stops accurately upon elapse of the time T. When the shoot time T has elapsed, the electron beam 58 is off-deflected (OFF mode) and thus shielded by the underlying blanking aperture plate 34, so this beam no longer reaches the workpiece placed on XY stage 36. In this way, workpiece 38 is written with the ultrafine circuit pattern while maximally suppressing or preventing linewidth variations occurring due to the fogging effect and proximity effect plus loading effect. Thus it is possible to attain the enhanced linewidth uniformity in the workpiece surface.

Another advantage of this embodiment lies in an ability to efficiently calculate the optimum beam dose while at the same time retaining high accuracy, without having to employ extra-high computer performances and extra-large capacity data storage memory. More specifically, the illustrative embodiment is arranged to employ a unique technique which follows: first, compute respective effect degrees in each of the rows and columns of unit regions for correction of the fogging and loading effects as divided from the "original image" of a circuit pattern; then, as for a given region relating to the circuit pattern data processing (e.g., a rectangle having its side length of several hundreds or thousands of μm), use its beam shoot position information to find and extract a specific pair of proximity effect correction coefficient η and base dose BD based on the loading effect-corrected size value; next, calculate the "final" beam dose from these data and the fog-effect correction value. Thus it is possible to effectively execute the beam dose computation even with the use of ordinary computer performances and semiconductor memory with standard data storage capacity.

On the contrary, prior known methodology—e.g., the prior art as taught from the Japanese document identified in the introduction of the description—is designed to execute processing of a vast amount of data for dividing a circuit pattern into global loading-effect correcting small square regions with each side length of 500 μm and 0.5-μm square small regions for proximity effect correction plus 50-nm square micro-loading effect small regions and then calculating one-by-one an influence map for each of these regions. Obviously, obtaining practically acceptable calculation speeds requires the use of a computer with exceptionally enhanced speed and ultrahigh computation performances in association with an extra-large capacity memory device.

A further advantage of the embodiment is that both the correction of mask inplane position-dependent fog effect-approximatable pattern linewidth variations—these occur during a fabrication process of photomasks in the manufacture of semiconductor devices—and the position-dependent loading effect correction at a time, in addition to the correctability of several kinds of effects with the magnitude being variable depending on the pattern area density. This in turn makes it possible to increase to higher levels the uniformity of circuit pattern segments being beam-depicted or "written" on a workpiece.

Figure 14:
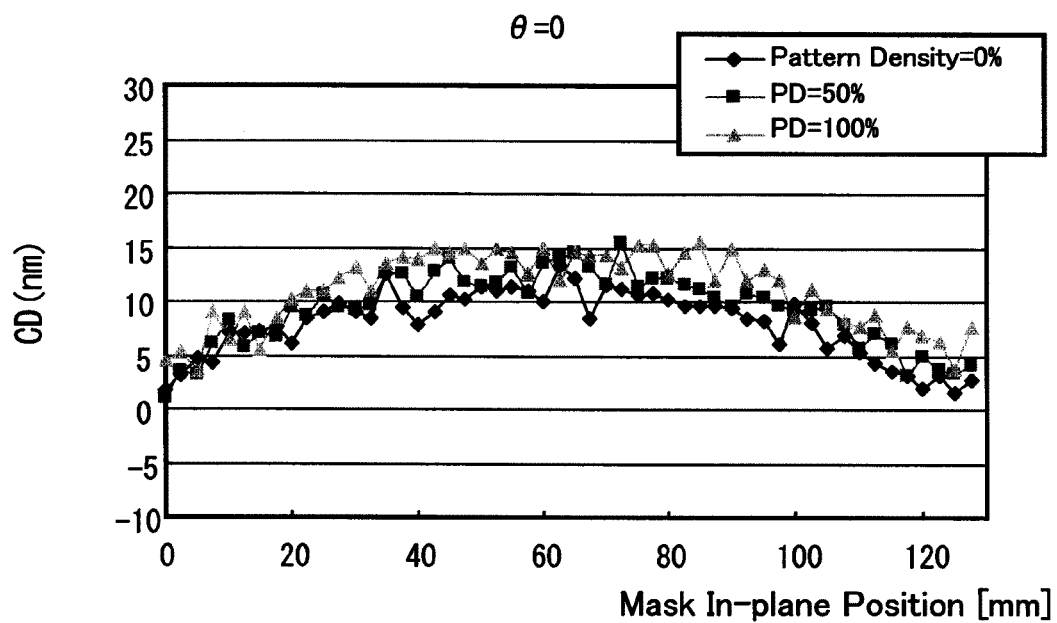
Figure 15:
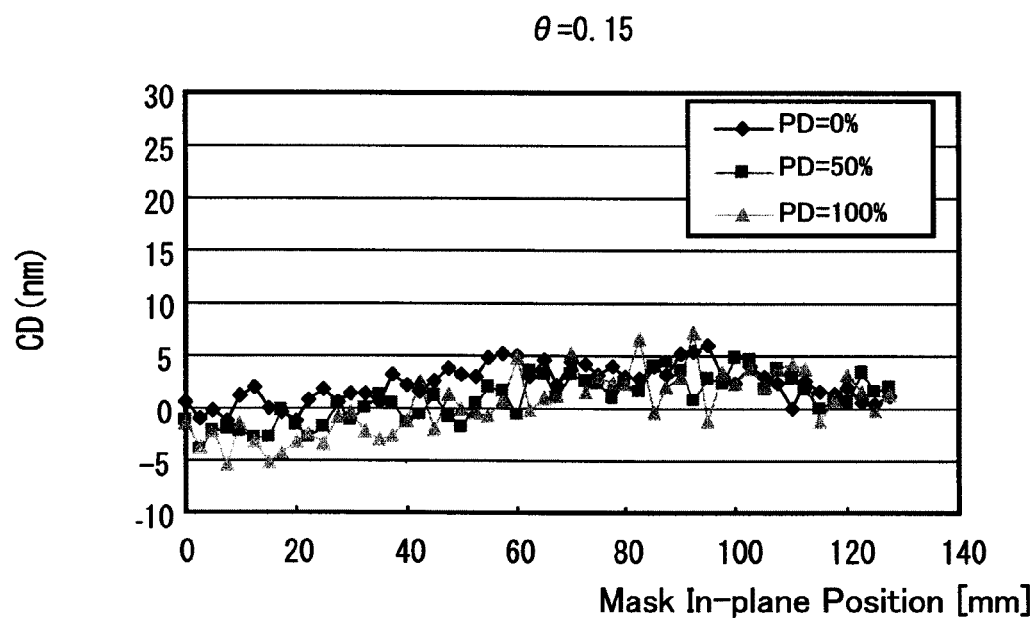

To make sure the effectivity of the pattern linewidth variation reduction" feature of the embodiment, an attempt was made to prepare test samples with various area density-different circuit patterns being formed thereon and then measure resultant linewidth sizes thereof. Measured linewidth values of a sample with the pattern formed thereon without the use of the fogging effect correction of the embodiment stated supra are plotted in a graph of FIG. 14, in units of pattern area densities of about 0%, 50% and 100%. As can be seen from this graph, the values of linewidth CD are relatively large for each area density. In addition, these are appreciably less in uniformity in a way depending on inplane positions. In contrast, measured linewidth values of a sample with the pattern being written thereon by use of the fog-effect correction scheme of the embodiment are shown in FIG. 14. From viewing this graph, it is appreciated that pattern segments of several area densities remain less in linewidth values CD and simultaneously were increased in uniformity.

Figure 16:
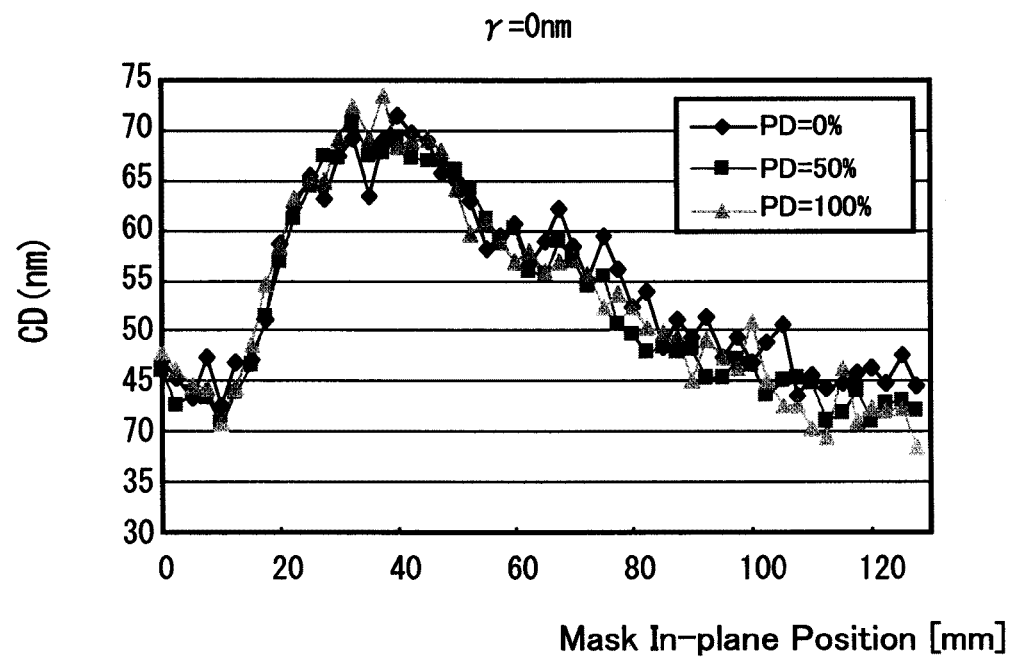
FIGS. 16 and 17 are graphs for inplane position distribution of measured line-width values of area density-different patterns formed on a workpiece, wherein the former is without the loading-effect linewidth correction whereas the latter is with this correction performed.
Figure 17:
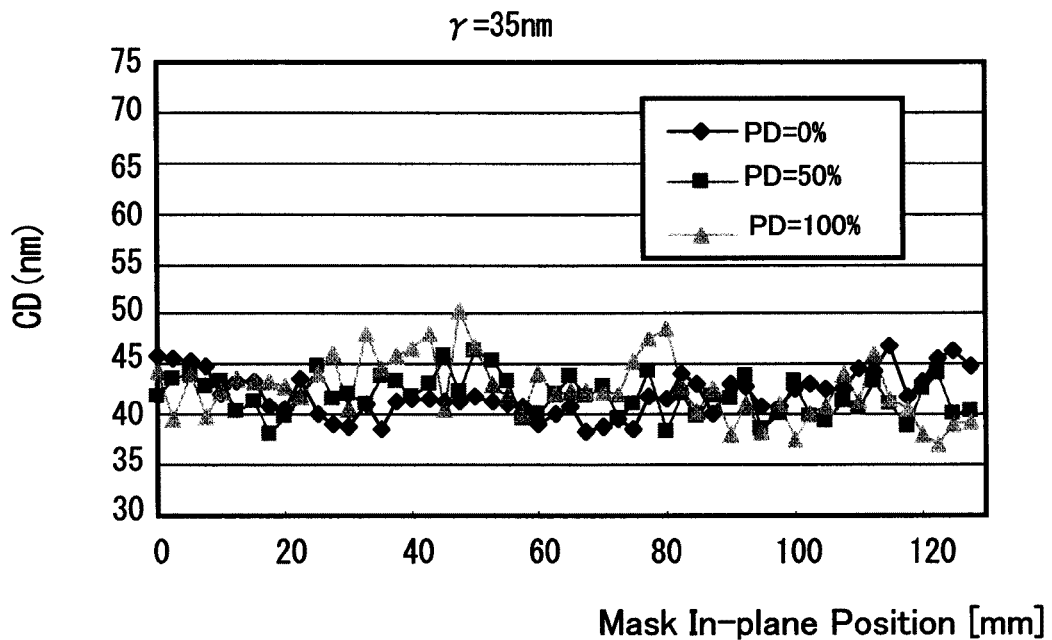

Regarding pattern linewidth variations occurring due to the loading effect also, a sample without the use of the embodiment technique is such that the measured linewidth values CD exhibit significant fluctuation depending on inplane locations as shown in FIG. 16. By contrast, as shown in FIG. 17, a sample with the pattern being formed thereon by using the loading effect correction technique of this embodiment is such that the linewidth values CD are kept relatively lessened without depending on inplane positions. Moreover, the uniformity thereof is appreciably improved.

While the invention has been described with reference to specific embodiments, the description is illustrative of the invention and is not to be construed as limiting the invention. For instance, the beam dose computing method as has been discussed in conjunction with FIG. 3 is applicable to other types of energy radiation beam-used pattern lithographic systems other than the EB lithography apparatus 20 of FIG. 1. Typical examples of such energy radiation are charged particle rays, ion rays and equivalents thereto. Additionally, the computation of the proximity effect-corrected beam dose Dp is modifiable so that this is applied to a limited number of specifically preselected unit regions that contain line pattern image segments, rather than simply applied to every unit region in the surface of a workpiece. By doing so, the system computer 40 decreases in entire workload required with its processing speed being increased while permitting the memory 52 to become less in data storage capacity needed.

Moreover, the mask, as the workpiece, created with EB writing apparatus is used for forming the pattern on a wafer. The pattern of this mask is reduced and transcribed on the wafer. And it passes through processes, such as a development process and an etching process. A size error may arise in process of the pattern transfer process to this wafer, or others. Since package transfer of the pattern of the mask is carried out to the wafer, it is necessary to correct these size errors in the stage of mask manufacture beforehand. Here, the size error produced on the wafer is measured beforehand, and the mask may be corrected by the BaseDose model using the BaseDose map and η map. In this case, the size error on the wafer can be obtained by the following relations using Qw(xw, yw) [nm], size error Q(x,y) [nm] on the mask and the rate α of reduction to transfer.

$$Q(x, y) = \frac{1}{\alpha} Q_w(\alpha x, \alpha y) \quad (11)$$

And the calculated size error Q(x,y) on the mask is added to the correction size value CD(x,y) for the loading effect correction the correction size value L(x,y) and the correction size value P(x,y). That is, the correction size value CD(x,y) is calculated by the sum of the size error Q(x,y) on the mask, the correction size value L(x,y) and the correction size value P(x,y). By using the sum total value as a correction size value CD(x,y), the wafer size error can also be corrected.

Additional advantages and modifications will readily occur to those skilled in the art. The invention in its broader aspects is not limited to the specific details and illustrative embodiments as shown and described herein. Various modifications may be made without departing from the spirit and scope of the general inventive concept defined by the appended claims and equivalents thereof.

What is claimed is:

1. A writing method comprising:
   specifying a matrix of rows and columns of regions as divided from a surface area of a target object to include first, second and third regions, the third regions being less in size than the first and second regions;
   determining first corrected doses of a charged particle beam for correcting fogging effects in the first regions;
   determining corrected size values for correcting pattern line width deviations occurring due to loading effects in the second regions;
   using said corrected size values in said second regions to create a map of base doses of the beam in respective ones of said second regions;
   using said corrected size values to prepare a map of proximity effect correction coefficients in respective ones of said second regions;
   using the maps to determine second corrected doses of said beam for correction of proximity effects in said third regions;
   using the first and second corrected doses to determine an actual beam dose at each position on the surface of said object; and
   controlling said beam in accordance with said actual beam dose to thereby write a pattern on said object.

2. The method of claim 1 wherein said determining first corrected doses includes:
   defining a first relative value depending upon a pattern area density in each said first region;
   defining a second relative value depending on a position on the surface of said object in each said first region; and
   obtaining a product of the first and second relative values, said product being used as the first corrected dose for correction of fogging effects.

3. The method of claim 2 wherein said determining corrected size values includes:
   defining a third value with pattern area density dependency in each said second region;
   defining a fourth value depending on an in-plane position of each said second region; and
   obtaining a sum of the third and fourth values for use as the corrected size value for correction of loading effects.

4. The method of claim 3 wherein the surface of said object includes a pattern formation area of a mask for use in manufacture of semiconductor devices.

5. A writing method comprising:
   specifying a matrix of rows and columns of regions as divided from a surface area of an exposure mask to include first, second and third regions, the third regions being less in size than the first and second regions, the exposure mask being used for exposing a semiconductor substrate;
   determining first corrected doses of a charged particle beam for correcting dimensional deviations occurring to the mask due to fogging effects in the first regions;
   determining corrected size values for correcting pattern line width deviations occurring to both the semiconductor substrate due to loading effects and the mask due to loading effects in the second regions;
   using said corrected size values in said second regions to create a map of base doses of the beam in respective ones of said second regions;
   using said corrected size values to prepare a map of proximity effect correction coefficients in respective ones of said second regions;
   using the maps to determine second corrected doses of said beam for correction of dimensional deviations occurring to the mask due to proximity effects in said third regions;
   using the first and second corrected doses to determine an actual beam dose at each position on the surface of said object; and
   controlling said beam in accordance with said actual beam dose to thereby write a pattern on said object.

6. A writing apparatus comprising:
   a table-like structure supporting thereon an exposure mask used for exposing a semiconductor substrate;
   a radiation source operative to emit a charged particle beam;

a pattern generator including more than one deflector and one or more apertures for guiding the beam toward the exposure mask to thereby permit writing of a pattern on said object;

a control unit connected to control said pattern generator; and said control unit including, first calculator means for specifying a matrix of rows and columns of regions as divided from a surface area of the exposure mask to include first, second and third regions, the third regions being less in size than the first and second regions, and for determining first corrected doses of a charged particle beam for correcting of dimensional deviations occurring to the mask due to fogging effects in the first regions, second calculator means for determining corrected size values for correcting pattern line width deviations occurring to both the semiconductor substrate due to loading effects and the mask due to loading effects in the second regions, for creating using said corrected size values in said second regions a map of base doses of the beam and a map of proximity effect correction coefficients in respective ones of said second regions, and determining by using these maps second corrected doses of said beam for correction of dimensional deviations occurring to the mask due to proximity effects in said third regions, and third calculator means for determining by use of the first and second corrected doses an actual beam irradiation time at each location on the exposure mask surface, whereby said control unit controls said deflector to deflect said beam in accordance with said beam irradiation time.

* * * * *

UNITED STATES PATENT AND TRADEMARK OFFICE
CERTIFICATE OF CORRECTION

| | | |
|---|---|---|
| PATENT NO. | : 8,103,980 B2 | Page 1 of 1 |
| APPLICATION NO. | : 12/566525 | |
| DATED | : January 24, 2012 | |
| INVENTOR(S) | : Keiko Emi et al. | |

It is certified that error appears in the above-identified patent and that said Letters Patent is hereby corrected as shown below:

On the title page, Item (75), the fourth inventor's name is incorrect. Item (75) should read:

-- Keiko Emi, Ibaraki (JP); Junichi Suzuki, Shizuoka (JP); Takayuki Abe, Kanagawa (JP); Tomohiro Iijima, Shizuoka (JP); Jun Yashima, Kanagawa (JP) --

Signed and Sealed this
Twenty-seventh Day of March, 2012

David J. Kappos
*Director of the United States Patent and Trademark Office*